(12) United States Patent
Kim et al.

(10) Patent No.: US 10,586,824 B2
(45) Date of Patent: Mar. 10, 2020

(54) IMAGE SENSOR

(71) Applicant: SAMSUNG ELECTRONICS CO., LTD., Suwon-si, Gyeonggi-do (KR)

(72) Inventors: Changhwa Kim, Hwaseong-si (KR); JungHun Kim, Suwon-si (KR); Sang-Su Park, Seoul (KR); Beomsuk Lee, Yongin-si (KR); Gang Zhang, Suwon-si (KR); Jaesung Hur, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/003,339

(22) Filed: Jun. 8, 2018

(65) Prior Publication Data

US 2019/0131340 A1 May 2, 2019

(30) Foreign Application Priority Data

Oct. 30, 2017 (KR) .......................... 10-2017-0142692

(51) Int. Cl.
| | |
|---|---|
| *H01L 27/146* | (2006.01) |
| *H01L 27/148* | (2006.01) |
| *H04N 5/335* | (2011.01) |
| *H01L 25/16* | (2006.01) |
| *G02B 5/20* | (2006.01) |

(52) U.S. Cl.
CPC .......... *H01L 27/14647* (2013.01); *G02B 5/20* (2013.01); *H01L 25/167* (2013.01); *H01L 27/14812* (2013.01); *H04N 5/335* (2013.01)

(58) Field of Classification Search
CPC ......... H01L 27/14647; H01L 27/14812; H01L 25/167; H04N 5/335; G02B 5/20
See application file for complete search history.

(56) References Cited

U.S. PATENT DOCUMENTS

| | | | |
|---|---|---|---|
| 7,528,068 | B2 | 5/2009 | Soejima et al. |
| 8,034,704 | B2 | 10/2011 | Komai et al. |
| 8,138,533 | B2 | 3/2012 | Koike et al. |
| 8,390,120 | B2 | 3/2013 | Moon et al. |
| 8,791,549 | B2 | 7/2014 | Chen et al. |
| 8,890,282 | B2 | 11/2014 | Lee et al. |

(Continued)

FOREIGN PATENT DOCUMENTS

| | | |
|---|---|---|
| JP | 4327644 B2 | 6/2009 |
| JP | 4415984 B2 | 12/2009 |

(Continued)

*Primary Examiner* — Abdelaaziz Tissire
(74) *Attorney, Agent, or Firm* — Lee IP Law, P.C.

(57) ABSTRACT

Disclosed is an image sensor including a substrate having a first surface and a second surface opposite to each other, a first photoelectric conversion region and a second photoelectric conversion region in the substrate, a through electrode between the first and second photoelectric conversion regions, an insulation structure on the second surface of the substrate, a first color filter and a second color filter respectively provided on the first and second photoelectric conversion regions, and a photoelectric conversion layer on the insulation structure and electrically connected to the through electrode. The through electrode include a first end adjacent to the first surface and a second end adjacent to the second surface. The first end has a non-planar shape.

19 Claims, 17 Drawing Sheets

(56) References Cited

U.S. PATENT DOCUMENTS

| | | | |
|---|---|---|---|
| 10,204,964 B1* | 2/2019 | Lee | H01L 27/307 |
| 2009/0305502 A1* | 12/2009 | Lee | H01L 21/76898 438/667 |
| 2010/0176271 A1 | 7/2010 | Rim et al. | |
| 2013/0140680 A1* | 6/2013 | Harada | H01L 21/76898 257/621 |
| 2014/0264862 A1* | 9/2014 | Tsai | H01L 25/00 257/741 |
| 2015/0001663 A1* | 1/2015 | Lee | H01L 27/14627 257/432 |
| 2015/0372036 A1* | 12/2015 | Su | H01L 27/1462 348/273 |
| 2017/0170238 A1* | 6/2017 | Lee | H01L 27/307 |
| 2017/0170239 A1* | 6/2017 | Lee | H01L 27/307 |
| 2018/0190707 A1 | 7/2018 | Lee et al. | |
| 2019/0027539 A1* | 1/2019 | Kim | H01L 27/307 |

FOREIGN PATENT DOCUMENTS

| | | | |
|---|---|---|---|
| KR | 10-2014-0058802 A | 5/2014 | |
| KR | 10-1692434 B1 | 1/2017 | |

\* cited by examiner

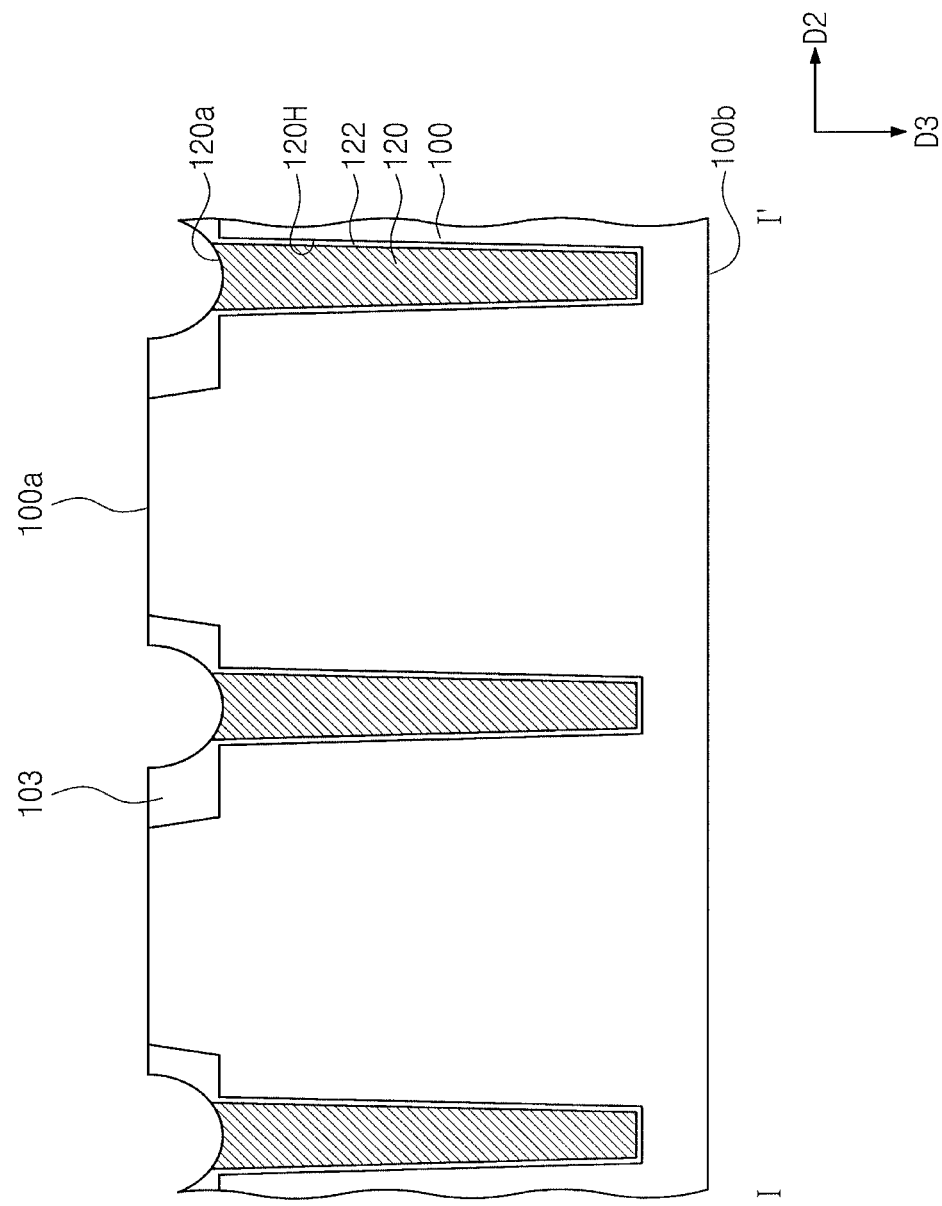

IMAGE SENSOR

CROSS-REFERENCE TO RELATED APPLICATION

Korean Patent Application No. 10-2017-0142692, filed on Oct. 30, 2017, in the Korean Intellectual Property Office, and entitled: "Image Sensor," is incorporated by reference

BACKGROUND

1. Field

Embodiments relate to an image sensor, and more particularly, to an image sensor including an organic photoelectric conversion layer.

2. Description of the Related Art

An image sensor is a semiconductor device to transform optical images into electrical signals. The image sensor may be classified into a charge coupled device (CCD) type and a complementary metal oxide semiconductor (CMOS) type. A CIS (CMOS image sensor) is a short for the CMOS type image sensor. The CIS has a plurality of two-dimensionally arranged pixels. Each of the pixels includes a photodiode. The photodiode serves to transform an incident light into an electrical signal.

SUMMARY

According to exemplary embodiments, an image sensor may include a substrate having a first surface and a second surface opposite to each other; a first photoelectric conversion region and a second photoelectric conversion region in the substrate; a through electrode between the first and second photoelectric conversion regions; an insulation structure on the second surface of the substrate; a first color filter and a second color filter respectively provided on the first and second photoelectric conversion regions; and a photoelectric conversion layer on the insulation structure and electrically connected to the through electrode. The through electrode may include a first end adjacent to the first surface and a second end adjacent to the second surface. The first end may have a non-planar shape.

According to exemplary embodiments, an image sensor may include a substrate having a first surface and a second surface opposite to each other; a first photoelectric conversion region and a second photoelectric conversion region in the substrate; a floating diffusion region on the first surface of the substrate; a photoelectric conversion layer on the second surface of the substrate; and a through electrode between the first and second photoelectric conversion regions. The through electrode may electrically connect the photoelectric conversion layer and the floating diffusion region to each other. An end of the through electrode may be adjacent to the first surface. A corner of the end of the through electrode may be located at a level different from that of a center of the end of the through electrode.

According to exemplary embodiments, an image sensor may include a first pixel having a first photoelectric conversion region; a second pixel having a second photoelectric conversion region; a photoelectric conversion layer on the first and second pixels; and a through electrode between the first and second pixels and electrically connected to the photoelectric conversion layer. The through electrode may have a first end and a second end opposite to the first end. The second end may be adjacent to the photoelectric conversion layer. The second end may have a planar shape and the first end having a non-planar shape.

BRIEF DESCRIPTION OF THE DRAWINGS

Features will become apparent to those of skill in the art by describing in detail exemplary embodiments with reference to the attached drawings in which:

FIGS. 7A to 10A illustrate cross-sectional views taken along line I-I' of FIG. 3, of stages in a method of manufacturing an image sensor according to exemplary embodiments.

FIGS. 7B to 10B illustrate cross-sectional views taken along line II-II' of FIG. 3, of stages in a method of manufacturing an image sensor according to exemplary embodiments.

DETAILED DESCRIPTION

Figure 1:
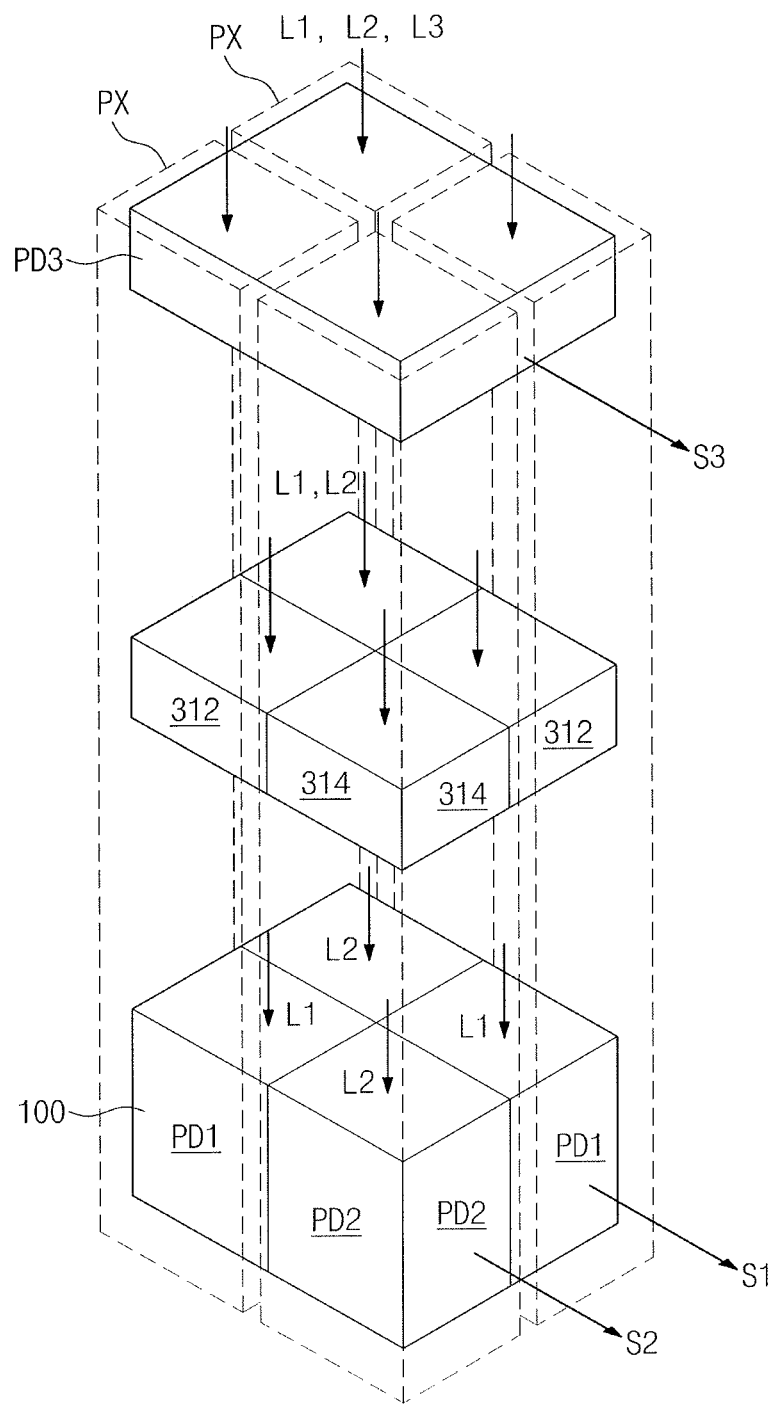
FIG. 1 illustrates a block diagram showing an image sensor according to exemplary embodiments.

FIG. 1 illustrates a block diagram showing an image sensor according to exemplary embodiments. Referring to FIG. 1, an image sensor according to some embodiments may include photoelectric conversion regions PD1 and PD2, color filters 312 and 314, and a photoelectric conversion layer PD3. The photoelectric conversion regions PD1 and PD2 may be provided in a substrate 100. The photoelectric conversion layer PD3 may be provided on a surface of the substrate 100, and the color filters 312 and 314 may be provided between the photoelectric conversion layer PD3 and the substrate 100.

The photoelectric conversion layer PD3 may receive a first light L1, a second light L2, and a third light L3 respectively having a first wavelength, a second wavelength, and a third wavelength. The first wavelength and the second wavelength may be different from the third wavelength. The first wavelength may be different from the second wavelength. For example, the first light L1 may correspond to a red color light, the second light L2 may correspond to a blue color light, and the third light L3 may correspond to a green color light.

The photoelectric conversion layer PD3 may absorb the third light L3, generating a third photoelectric signal S3 from the third light L3. The first light L1 and the second light L2 may pass through the photoelectric conversion layer PD3. The photoelectric conversion layer PD3 may be commonly shared by a plurality of pixels PX.

The lights L1 and L2 may be incident onto the color filters 312 and 314 after passing through the photoelectric conversion layer PD3. The color filters 312 and 314 may include first color filters 312 and second color filters 314. Each of the pixels PX may include one of the first and second color filters 312 and 314. The first light L1 may pass through the first color filter 312, but not through the second color filter 314. The second light L2 may pass through the second color filter 314, but not through the first color filter 312.

The photoelectric conversion regions PD1 and PD2 may include first photoelectric conversion regions PD1 and second photoelectric conversion regions PD2. Each of the pixels PX may include one of the first photoelectric conversion region PD1 and the second photoelectric conversion region PD2. The pixel PX including the first color filter 312 may include the first photoelectric conversion region PD1, and the pixel PX including the second color filer 314 may include the second photoelectric conversion region PD2. For example, the first photoelectric conversion region PD1 may be provided below the first color filter 312, and the second photoelectric conversion region PD2 may be provided below the second color filter 314.

The first color filter 312 may transmit the first light L1 onto the first photoelectric conversion region PD1. The first photoelectric conversion region PD1 may generate a first photoelectric signal S1 from the first light L1. The second color filter 314 may transmit the second light L2 onto the second photoelectric conversion region PD2. The second photoelectric conversion region PD2 may generate a second photoelectric signal S2 from the second light L2.

In some embodiments, the photoelectric conversion layer PD3 may be disposed on (or above) the photoelectric conversion regions PD1 and PD2 such that an image sensor may have an increased integration.

Hereinafter, an operation of the photoelectric conversion layer PD3 will be discussed with reference to FIGS. 2A and 2B, and an operation of the photoelectric conversion regions PD1 and PD2 will be discussed with reference to FIG. 2C.

Figure 2A:
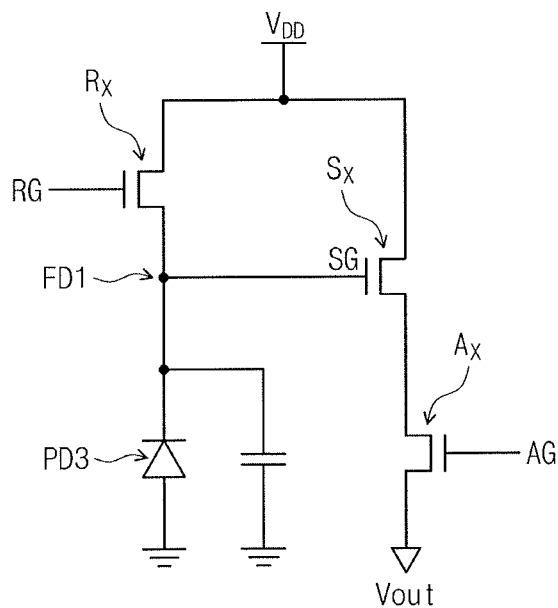
FIGS. 2A and 2B illustrate circuit diagrams showing an operation of a photoelectric conversion layer of an image sensor according to exemplary embodiments.
Figure 2B:
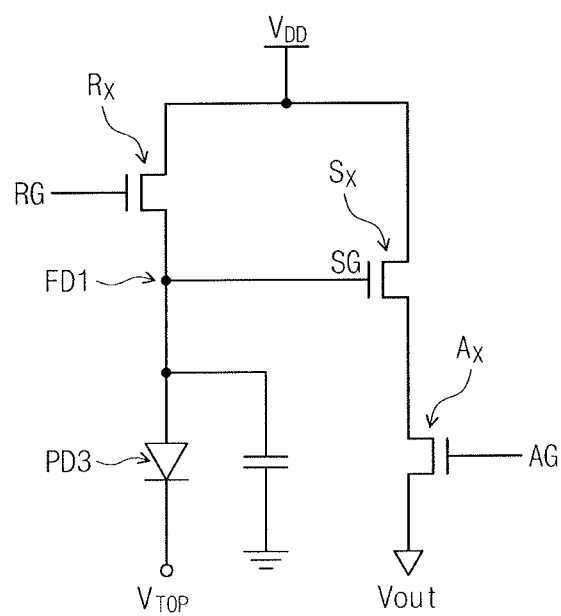

FIGS. 2A and 2B illustrate circuit diagrams showing an operation of a photoelectric conversion layer of an image sensor according to exemplary embodiments. Referring to FIGS. 2A and 2B, each of pixels may include a first source follower transistor Sx, a first reset transistor Rx, and a first select transistor Ax. The first source follower transistor Sx, the first reset transistor Rx, and the first select transistor Ax may respectively include a first source follower gate SG, a first reset gate RG, and a first select gate AG.

A first floating diffusion region FD1 may serve as a source of the first reset transistor Rx. The first floating diffusion region FD1 may be electrically connected to the first source follower gate SG of the first source follower transistor Sx. The first source follower transistor Sx may be connected to the first select transistor Ax.

In relation to the photoelectric conversion layer PD3, each pixel may operate as follows. When in a light-blocked state, a power voltage VDD may be applied to a drain of the first reset transistor Rx and a drain of the first source follower transistor Sx, and the first reset transistor Rx may be turned on, with the result that charges remaining in the first floating diffusion region FD1 may be discharged. After discharging the remaining charges from the first floating diffusion region FD1, the first reset transistor Rx may be turned off.

When external light is incident onto the photoelectric conversion layer PD3, photo-charges (i.e., electron-hole pairs) may be generated in the photoelectric conversion layer PD3. When a voltage VTOP is applied to the photoelectric conversion layer PD3, the generated photo-charges may be transferred to and accumulated in the first floating diffusion region FD1. FIG. 2A illustrates a circuit diagram in the case where electrons act as the photo-charges transferred from the photoelectric conversion layer PD3 to the first floating diffusion region FD1, and FIG. 2B illustrates a circuit diagram in the case where holes act as the photo-charges transferred from the photoelectric conversion layer PD3 to the first floating diffusion region FD1. A gate bias of the first source follower transistor Sx may be changed in proportion to an amount of charges accumulated in the first floating diffusion region FD1, and this may lead to a change in source potential of the first source follower transistor Sx. If the first select transistor Ax is turned on, an output line Vout may output signals originating from the light incident onto the photoelectric conversion layer PD3.

FIGS. 2A and 2B show that a single pixel includes three transistors Rx, Sx, and Ax, but embodiments are not limited thereto. For example, neighboring pixels may share one or more of the first reset transistor Rx, the first source follower transistor Sx, and the first select transistor Ax. Therefore, an image sensor may increase in integration.

Figure 2C:
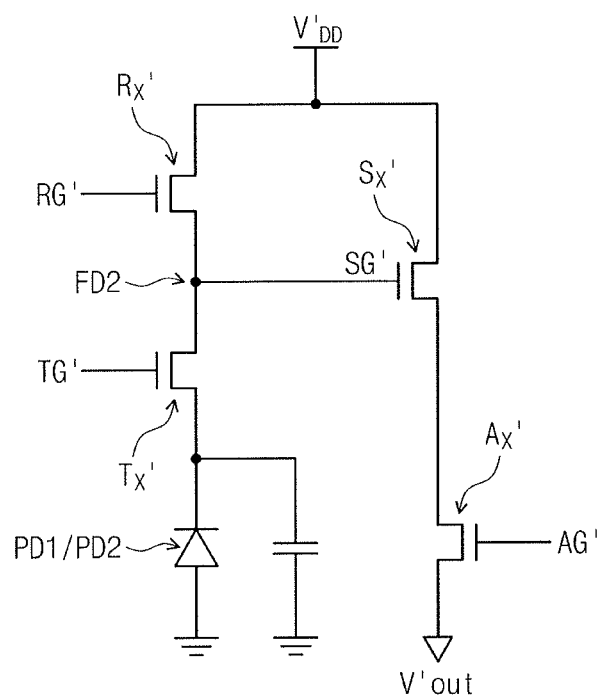
FIG. 2C illustrates a circuit diagram showing an operation of a photoelectric conversion layer of an image sensor according to exemplary embodiments.

FIG. 2C illustrates a circuit diagram showing an operation of a photoelectric conversion layer of an image sensor according to exemplary embodiments. Referring to FIG. 2C, each of pixels may further include a transfer transistor Tx'; a second source follower transistor Sx', a second reset transistor Rx', and a second select transistor Ax'. The transfer transistor Tx'; the second source follower transistor Sx', the second reset transistor Rx', and the second select transistor Ax' may respectively include a transfer gate TG', a second source follower gate SG', a second reset gate RG', and a second select gate AG'.

A second floating diffusion region FD2 may serve as a drain of the transfer transistor Tx'. The second floating diffusion region FD2 may serve as a source of the second reset transistor Rx'. The second floating diffusion region FD2 may be electrically connected to the second source follower gate SG' of the second source follower transistor Sx'. The second source follower transistor Sx' may be connected to the second select transistor Ax'.

When external light is incident onto the photoelectric conversion regions PD1 and PD2, electron-hole pairs may be generated in the photoelectric conversion regions PD1 and PD2. The generated holes may be transferred to and accumulated in p-type impurity regions of the photoelectric conversion regions PD1 and PD2, and the generated electrons may be transferred to and accumulated in n-type regions of the photoelectric conversion regions PD1 and PD2. When the transfer transistor Tx' is turned on, the generated charges (i.e., holes or electrons) may be transferred to and accumulated in the second floating diffusion region FD2.

The second source follower transistor Sx', the second reset transistor Rx', and the second select transistor Ax' may have their operations and functions substantially the same as those of the first source follower transistor Sx, the first reset transistor Rx, and the first select transistor Ax discussed above with reference to FIGS. 2A and 2B.

In some embodiments, the second source follower transistor Sx', the second reset transistor Rx', and the second select transistor Ax' may be provided separately from and operated independently of the first source follower transistor Sx, the first reset transistor Rx, and the first select transistor Ax, respectively.

In other embodiments, one or more of the first source follower transistor Sx, the first reset transistor Rx, and the first select transistor Ax, which are discussed above with reference to FIGS. 2A and 2B, may be shared by the photoelectric conversion layer PD3 and the photoelectric conversion regions PD1 and PD2. In this case, the second source follower transistor Sx', the second reset transistor Rx', and/or the second select transistor Ax' may not be separately provided.

Figure 3:
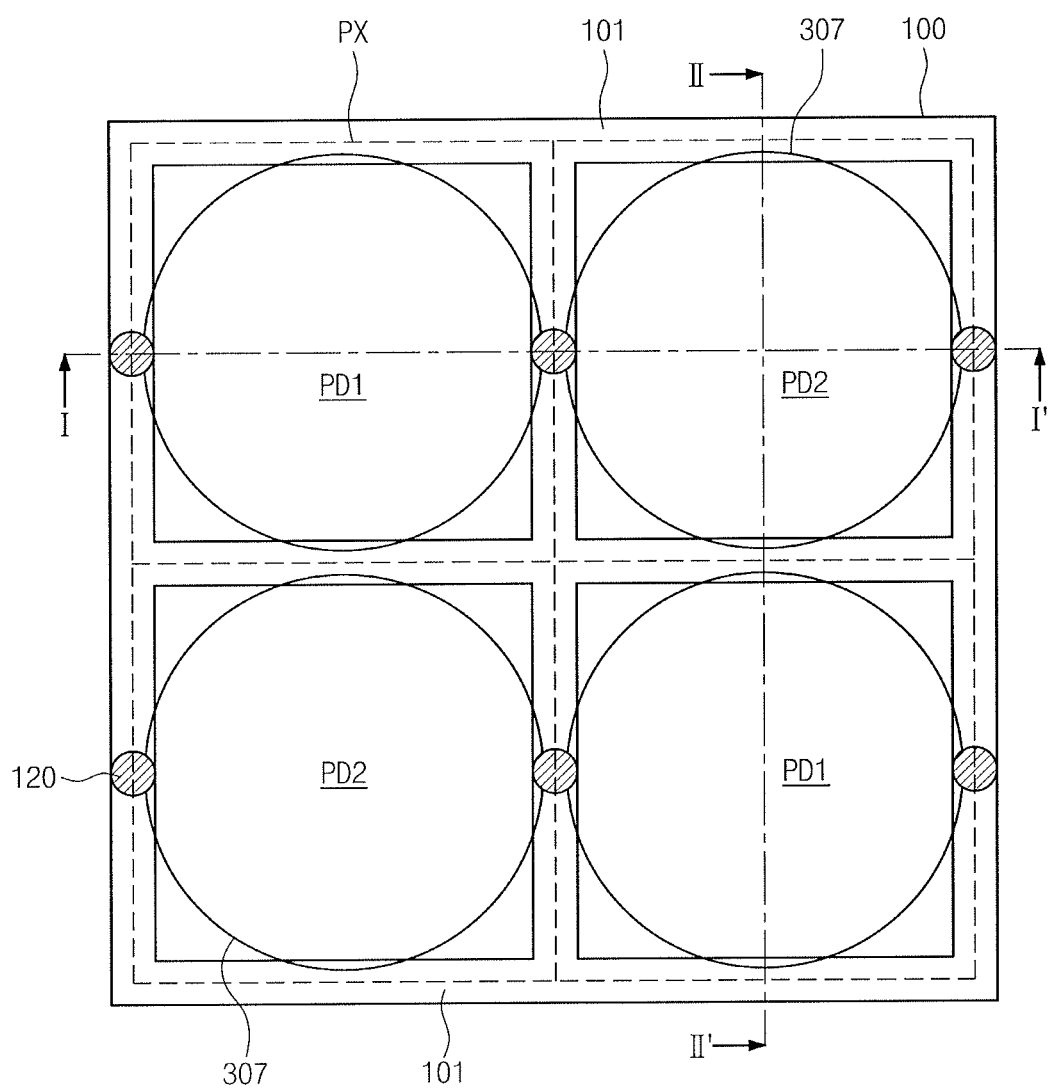
FIG. 3 illustrates a plan view showing an image sensor according to exemplary embodiments.
Figure 4A:
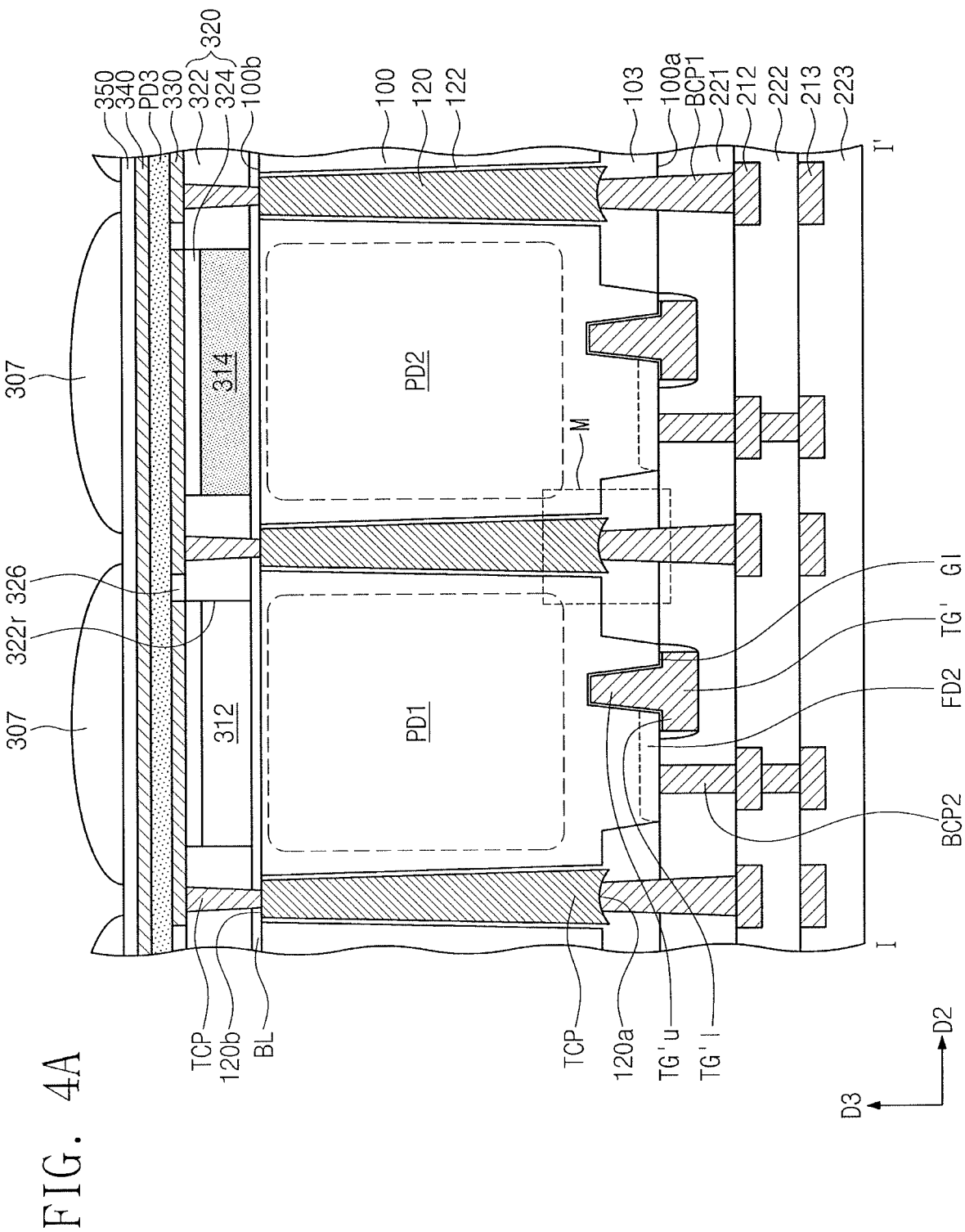
FIG. 4A illustrates a cross-sectional view taken along line I-I' of FIG. 3.

FIG. 3 illustrates a plan view showing an image sensor according to exemplary embodiments. FIG. 4A illustrates a cross-sectional view taken along line I-I' of FIG. 3, and FIG. 4B illustrates a cross-sectional view taken along line II-II' of FIG. 3.

Figure 4B:
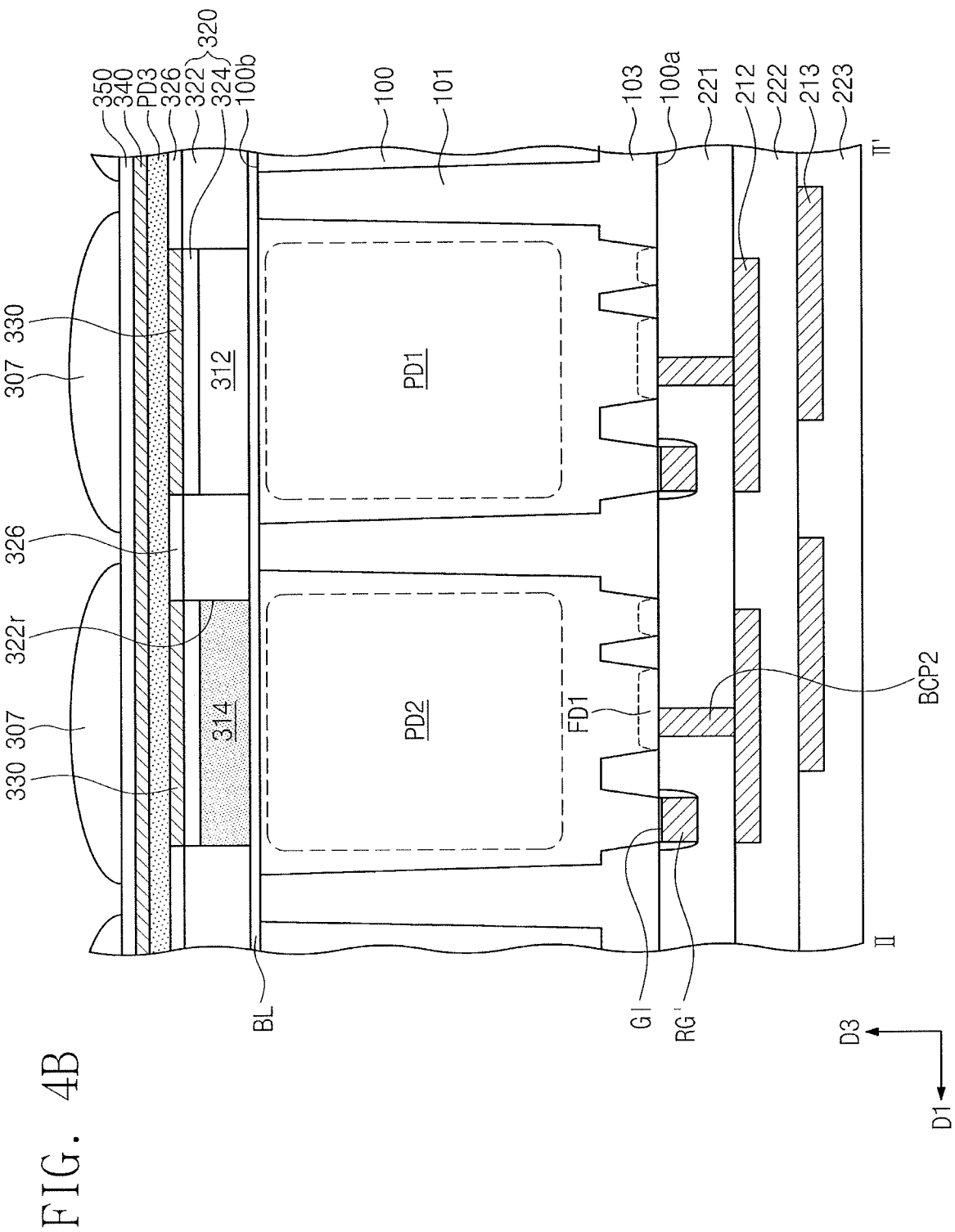
FIG. 4B illustrates a cross-sectional view taken along line II-II' of FIG. 3.

Referring to FIGS. 3, 4A, and 4B, an image sensor according to some embodiments may include a substrate 100. The substrate 100 may have a first surface 100a and a second surface 100b opposite to each other along a third direction D3. The first surface 100a of the substrate 100 may be a front surface, and the second surface 100b of the substrate 100 may be a rear surface. For example, the substrate 100 may be or include a bulk silicon substrate, a silicon-on-insulator (SOI) substrate, or a semiconductor epitaxial layer. The substrate 100 may have a first conductivity (e.g., p-type conductivity).

The substrate 100 may include a plurality of pixels PX that are two-dimensionally arranged in a matrix. For example, the pixels PX may be two-dimensionally arranged along a first direction D1 and a second direction D2 intersecting the first direction D1.

A first device isolation layer 101 may be provided in the substrate 100. The first device isolation layer 101 may extend along the third direction D3 from the first surface 100a toward the second surface 100b of the substrate 100. The first device isolation layer 101 may define the pixels PX. For example, the first device isolation layer 101 may be disposed between the pixels PX, e.g., may extend therebetween along the first and second directions D1 and D2, such that each pixel may be surrounded by the first device isolation layer in plan view.

Second device isolation layers 103 may be provided in the substrate 100. The second device isolation layers 103 may be shallow device isolation layers formed on the first surface 100a of the substrate 100. Bottom surfaces of the second device isolation layers 103 may have surfaces substantially coplanar with the first surface 100a of the substrate 100. The second device isolation layers 103 may have depths, e.g., along the third direction D3, less than that of the first device isolation layer 101.

The second device isolation layers 103 may define an active region in the pixel PX. The active region may be provided for operation of transistors disposed on the first surface 100a of the substrate 100. For example, the transistors may include the transistors Rx, Sx, Ax, Tx', Rx', Sx', and Ax' discussed above with reference to FIGS. 2A to 2C. For example, the first and second device isolation layers 101 and 103 may include silicon oxide, silicon nitride, or silicon oxynitride.

Through electrodes 120 may be provided in the substrate 100. When viewed in plan, the through electrodes 120 may be disposed between the pixels PX. For example, the through electrodes 120 may be disposed between the pixels PX adjacent to each other along the second direction D2.

The through electrodes 120 and the pixels PX may be alternately arranged along the second direction D2.

Each of the through electrodes 120 may extend along the third direction D3 perpendicular to the first surface 100a of the substrate 100. Each of the through electrodes 120 may have an end 120b having a planar shape. The end 120b of each of the through electrodes 120 may be substantially coplanar with the second surface 100b of the substrate 100. Each of the through electrodes 120 may have a width that decreases upwardly from the first surface 100a toward the second surface 100b of the substrate 100 along the third direction D3. Each of the through electrodes 120 may have an opposite end 120a adjacent to the first surface 100a of the substrate 100. The second device isolation layer 103 may be provided on the opposite end 120a of each of the through electrodes 120. The through electrodes 120 may include a conductive material. For example, the through electrodes 120 may include n-type doped polysilicon or p-type doped polysilicon.

A through insulation pattern 122 may be provided between the substrate 100 and sidewalls of each of the through electrodes 120. For example, the through insulation pattern 122 may include silicon oxide, silicon nitride, or silicon oxynitride.

First and second photoelectric conversion regions PD1 and PD2 may be provided in the pixels PX of the substrate 100. The first photoelectric conversion regions PD1 may correspond to the first photoelectric conversion regions PD1 discussed with reference to FIG. 1, and the second photoelectric conversion regions PD2 may correspond to the second photoelectric conversion regions PD2 discussed with reference to FIG. 1. The first and second photoelectric conversion regions PD1 and PD2 may be two-dimensionally arranged. When viewed in plan, the first and second photoelectric conversion regions PD1 and PD2 may be alternately arranged.

The first and second photoelectric conversion regions PD1 and PD2 may be impurity doped regions each having a second conductivity (e.g., n-type conductivity) different from the first conductivity (e.g., p-type conductivity). For example, each of the first and second photoelectric conversion regions PD1 and PD2 may include a portion adjacent to the first surface 100a and a portion adjacent to the second surface 100b. A difference in impurity concentration may be present between the portion adjacent to the first surface 100a and the portion adjacent to the second surface 100b. For example, each of the first and second photoelectric conversion regions PD1 and PD2 may have a potential slope between the first surface 100a and the second surface 100b of the substrate 100.

The substrate 100 may be provided therein with first floating diffusion regions FD1 and second floating diffusion regions FD2. For example, the first floating diffusion region FD1 and the second floating diffusion region FD2 may be provided in each of the pixels PX of the substrate 100. Each of the first floating diffusion regions FD1 may correspond to the first floating diffusion region FD1 discussed above with reference to FIGS. 2A and 2B, and each of the second floating diffusion regions FD2 may correspond to the second floating diffusion region FD2 discussed above with reference to FIG. 2C.

In each of the pixels PX, the first floating diffusion region FD1 and the second floating diffusion region FD2 may be adjacent to the first surface 100a of the substrate 100. In each of the pixels PX, the first floating diffusion region FD1 and the second floating diffusion region FD2 may be spaced apart from each other, and the second device isolation layer 103 may be provided between the first floating diffusion region FD1 and the second floating diffusion region FD2. In each of the pixels PX, the first floating diffusion region FD1 and the second floating diffusion region FD2 may be electrically separated from each other by potential barrier. Each of the first floating diffusion region FD1 and the second floating diffusion region FD2 may be an impurity doped region having the second conductivity (e.g., n-type conductivity).

Transfer transistors including transfer gates TG' may be disposed on the first surface 100a of the substrate 100. The transfer gate TG' may be provided on each of the pixels PX. The second floating diffusion region FD2 may be placed on a side of the transfer gate TG'.

Each of the transfer gates TG' may include a lower portion TG'1 within the substrate 100 and an upper portion TG'u. The upper portion TG'u may be connected to the lower portion TG'1 and may protrude above the first surface 100a of the substrate 100 along the third direction D3. The lower portion TG'1 may extend further along the second direction D2 than the upper portion TG'u. The upper portion TG'u may have a width along the second direction that decreases along the third direction D3 away form the first surface 100a of the substrate 100. The transfer gates TG' may correspond to the transfer gates TG' discussed above with reference to FIG. 2C.

A gate dielectric pattern GI may be provided between the substrate 100 and each of the transfer gates TG'. For example, the gate dielectric pattern GI may include a high-k dielectric material. In particular, the gate dielectric pattern GI maybe on an upper surface of the lower portion TG'1, and on sidewalls and an upper surface of the upper portion TG'u.

A first source follower transistor, a first reset transistor, a first select transistor, a second source follower transistor, a second reset transistor including a second rest gate RG', and/or a second select transistor may be provided on the first surface 100a of the substrate 100. The transistors may be configured to perform substantially the same function and operation as those discussed above with reference to FIGS. 2A to 2C.

First, second, and third interlayer dielectric layers 221, 222, and 223 may be provided below the first surface 100a of the substrate 100. For example, each of the first to third interlayer dielectric layers 221 to 223 may include silicon oxide, silicon nitride, or silicon oxynitride. The first interlayer dielectric layer 221 may cover the gates (e.g., the transfer gates TG' and the reset gates RG') on the first surface 100a of the substrate 100.

First bottom contact plugs BCP1 may penetrate the first interlayer dielectric layer 221 to come into contact with the through electrodes 120. The first bottom contact plugs BCP1 may be in direct contact with the opposite ends 120a of the through electrodes 120. Each of the first bottom contact plugs BCP1 may have a width less than that of each of the through electrodes 120. The width of each of the first bottom contact plugs BCP1 may decrease along the third direction D3 towards the through electrode 120.

Second bottom contact plugs BCP2 may penetrate the first interlayer dielectric layer 221 to come into contact with the first and second floating diffusion regions FD1 and FD2. Each of the second bottom contact plugs BCP2 may have a length in the third direction D3 different from a length in the third direction D3 of each of the first bottom contact plugs BCP1. For example, the length in the third direction D3 of each of the second bottom contact plugs BCP2 may be less than the length in the third direction D3 of each of the first bottom contact plugs BCP1. The first and second bottom contact plugs BCP1 and BCP2 may include metal (e.g., tungsten).

First lines 212 may be provided in the second interlayer dielectric layer 222, and second lines 213 may be provided in the third interlayer dielectric layer 223. The first and second lines 212 and 213 may include metal (e.g., tungsten).

A buffer layer BL may be provided on the second surface 100b of the substrate 100. The buffer layer BL may suppress the photoelectric conversion regions PD1 and PD2 from receiving charges (i.e., electrons or holes) originating from a defect on the second surface 100b of the substrate 100. The buffer layer BL may include metal oxide. For example, the buffer layer BL may include aluminum oxide or hafnium oxide.

An insulation structure 320 may be provided on the buffer layer BL. For example, the insulation structure 320 may include silicon oxide, silicon nitride, or silicon oxynitride. For example, the insulation structure 320 may include a first insulation pattern 322 having recesses 322r. When viewed in plan, the recesses 322r of the first insulation pattern 322 may correspond to the pixels PX of the substrate 100. The recesses 322r may expose the buffer layer BL.

Each of the recesses 322r may be provided therein with one of the first color filter 312 and the second color filter 314. Thus, the first and second color filters 312 and 314 may be buried in the insulation structure 320. The first color filters 312 may correspond to the first color filters 312 discussed above with reference to FIG. 1, and the second color filters 314 may correspond to the second color filters 314 discussed above with reference to FIG. 1. When viewed in plan, the first color filters 312 may be disposed on the first photoelectric conversion regions PD1, and the second color filters 314 may be disposed on the second photoelectric conversion regions PD2.

As discussed above with reference to FIGS. 1 and 2C, the first color filter 312 may allow the first light L1 to pass through. The first photoelectric conversion region PD1 may generate charges (i.e., electron-hole pairs) from the first light L1. When the transfer transistor Tx' is turned on, the generated charges (i.e., holes or electrons) may be transferred to and accumulated in the second floating diffusion region FD2. The second color filter 314 may allow the second light L2 to pass through. The second photoelectric conversion region PD2 may generate charges (i.e., electron-hole pairs) from the second light L2. When the transfer transistor Tx' is turned on, the generated charges (i.e., holes or electrons) may be transferred to and accumulated in the second floating diffusion region FD2.

The insulation structure 320 may further include second insulation patterns 324 provided on the first and second color filters 312 and 314. The second insulation patterns 324 may be provided in corresponding recesses 322r and spaced apart from each other.

Top contact plugs TCP may penetrate the insulation structure 320 and the buffer layer BL to come into contact with the through electrodes 120. The top contact plugs TCP may be in direct contact with the ends 120b of the through electrodes 120. Each of the top contact plugs TCP may have a width less than that of each of the through electrodes 120 along the second direction D2. The width of each of the top contact plugs TCP may decrease with approaching the through electrode 120 (or the second surface 100b of the substrate 100). For example, the top contact plugs TCP may include metal (e.g., tungsten).

Bottom electrodes 330 may be provided on the insulation structure 320. When viewed in plan, the bottom electrodes 330 may be disposed to correspond to the pixels PX of the substrate 100 and spaced apart from each other. Each of the bottom electrodes 330 may be connected to the top contact plug TCP.

The bottom electrodes 330 may include a transparent conductive material. For example, the bottom electrodes 330 may include ITO (Indium Tin Oxide), IZO (Indium Zinc Oxide), ZnO (Zinc Oxide), or an organic transparent conductive material.

A third insulation pattern 326 may be provided to fill a gap between the bottom electrodes 330. The third insulation pattern 326 may have a top surface substantially coplanar with those of the bottom electrodes 330. For example, the third insulation pattern 326 may include silicon oxide, silicon nitride, or silicon oxynitride.

A photoelectric conversion layer PD3 may be provided on the bottom electrodes 330 and the third insulation pattern 326. The photoelectric conversion layer PD3 may correspond to the photoelectric conversion layer PD3 discussed above with reference to FIGS. 1, 2A, and 2B. As discussed above with reference to FIG. 1, the photoelectric conversion layer PD3 may absorb the third light L3 to generate charges (e.g., electron-hole pairs) from the third light L3. The generated charges may be transferred to and accumulated in the first floating diffusion region FD1 after traveling through the bottom electrode 230, the top contact plug TCP, the through electrode 120, the first bottom contact plug BCP1, the first line 212, and the second bottom contact plug BCP2.

For example, the photoelectric conversion layer PD3 may include an organic photoelectric conversion layer. The photoelectric conversion layer PD3 may include a p-type organic semiconductor material and an n-type organic semiconductor material, which form a p-n junction. For another example, the photoelectric conversion layer PD3 may include quantum dots or chalcogenide.

A top electrode 340 may be provided on the photoelectric conversion layer PD3. The top electrode 340 may cover a top surface of the photoelectric conversion layer PD3. The top electrode 340 may include a transparent conductive material. For example, the top electrodes 340 may include ITO (Indium Tin Oxide), IZO (Indium Zinc Oxide), ZnO (Zinc Oxide), or an organic transparent conductive material.

A capping layer 350 may be provided on the top electrode 340. The capping layer 350 may include an insulating material. For example, the capping layer 350 may include aluminum oxide, silicon oxide, silicon nitride, or silicon oxynitride.

Micro-lenses 307 may be provided on the capping layer 350. When viewed in plan, the micro-lenses 307 may be disposed to correspond to the pixels PX. Each of the micro-lenses 307 may have a convex shape and a predetermined radius of curvature.

Figure 5A:
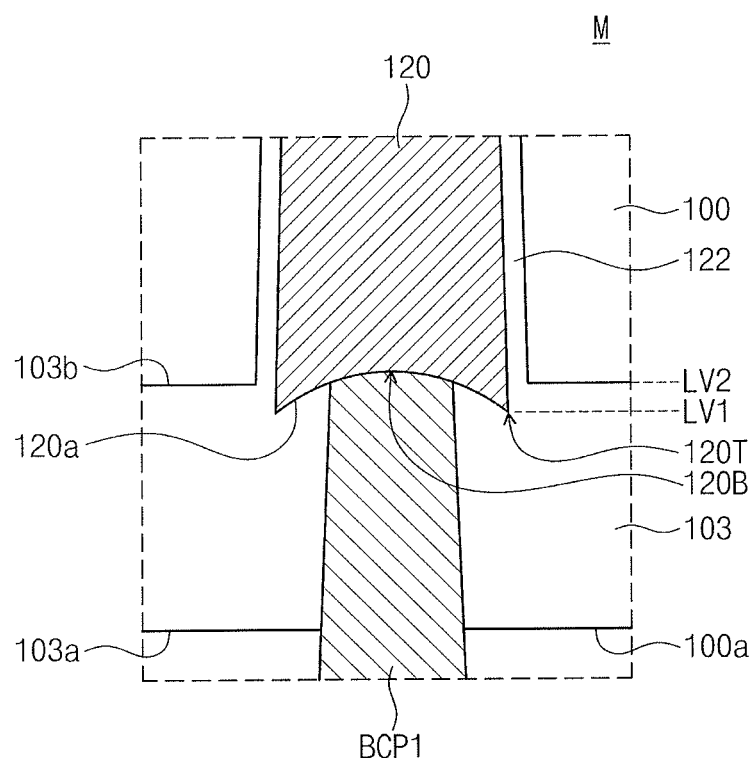
FIG. 5A illustrates an enlarged cross-sectional view of section M in FIG. 4A, showing an example of a through electrode according to exemplary embodiments.

FIG. 5A illustrates an enlarged cross-sectional view of section M in FIG. 4A, showing an example of a through electrode according to exemplary embodiments. Referring to FIGS. 4A and 5A, the second device isolation layer 103 may have a first surface 103a and a second surface 103b opposite to each other.

The first surface 103a of the second device isolation layers 103 may be substantially coplanar with the first surface 100a of the substrate 100. The opposite end 120a of the through electrode 120 may have a rounded shape. The opposite end 120a of the through electrode 120 may have a non-planar shape, e.g., a concave shape. The opposite end 120a of the through electrodes 120 may be recessed toward the second surface 100b of the substrate 100. The opposite end 120a of the through electrode 120 may have a corner 120T that protrudes toward the first surface 100a of the substrate 100 (or the first surface 103a of the second device isolation layer 103) more than a center 120B of the opposite end 120a of the through electrode 120, e.g., may overlap the first bottom contact plug BCP1 along the second direction D2.

The corner 120T of the opposite end 120a of the through electrode 120 may be located at a first level LV1, and the second surface 103b of the second device isolation layer 103 may be located at a second level LV2. The first level LV1 may be lower than the second level LV2. For example, a vertical distance between the corner 120T of the opposite end 120a and the first surface 103a of the second device isolation layer 103 may be less than a vertical distance between the second surface 103b of the second device isolation layer 103 and the first surface 103a of the second device isolation layer 103.

The first bottom contact plug BCP1 may have an end in contact with the opposite end 120a of the through electrode 120. The end of the first bottom contact plug BCP1 may have a convex shape corresponding to the shape of the opposite end 120a of the through electrode 120, e.g., contact surfaces of the first bottom contact plug BCP1 and the opposite end 120a of the through electrode 120 may be complementary. For example, the end of the first bottom contact plug BCP1 adjacent the through electrode 120 may protrude toward the second surface 100b of the substrate 100. Since the opposite end 120a of the through electrode 120 has a rounded shape, a contact area between the opposite end 120a and the first contact plug BCP1 may become relatively increased. Therefore, a resistance may be minimized or reduced between the through electrode 120 and the first bottom contact plug BCP1.

Figure 5B:
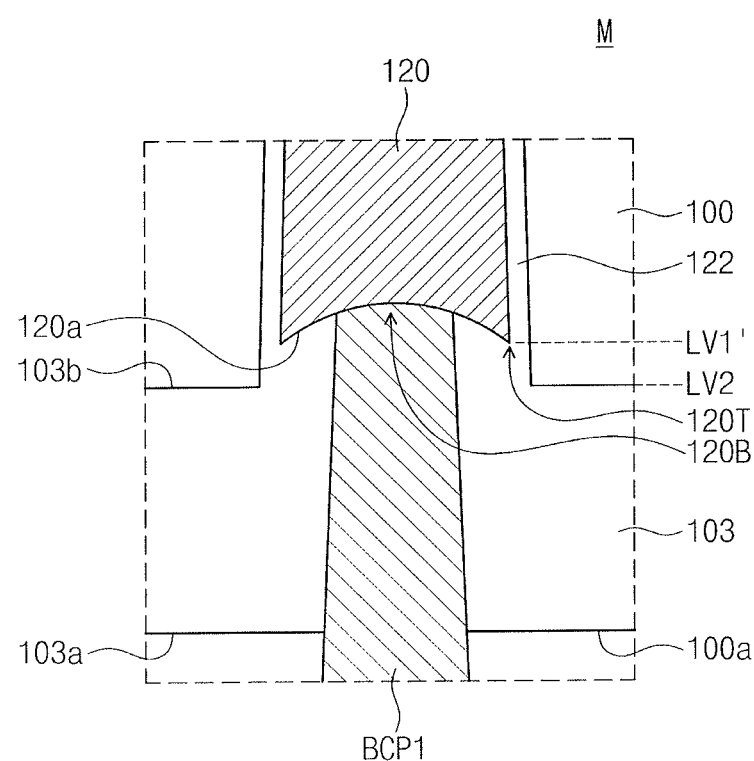
FIG. 5B illustrates an enlarged cross-sectional view of section M in FIG. 4A, showing an example of a through electrode according to exemplary embodiments.

FIG. 5B illustrates an enlarged cross-sectional view of section M in FIG. 4A, showing an example of a through electrode according to exemplary embodiments. In the embodiment that follows, a detailed description of features repetitive to those discussed above with reference to FIGS. 4A and 5A will be omitted, and a difference thereof will be discussed in detail Referring to FIGS. 4A and 5B, the corner 120T of the opposite end 120a of the through electrode 120 may be located at a first level LV1', and the second surface 103b of the second device isolation layer 103 may be located at the second level LV2. The first level LV1' may be higher than the second level LV2. For example, a vertical distance between the corner 120T of the opposite end 120a and the first surface 103a of the second device isolation layer 103 may be greater than a vertical distance between the second surface 103b of the second device isolation layer 103 and the first surface 103a of the second device isolation layer 103.

Figure 6A:
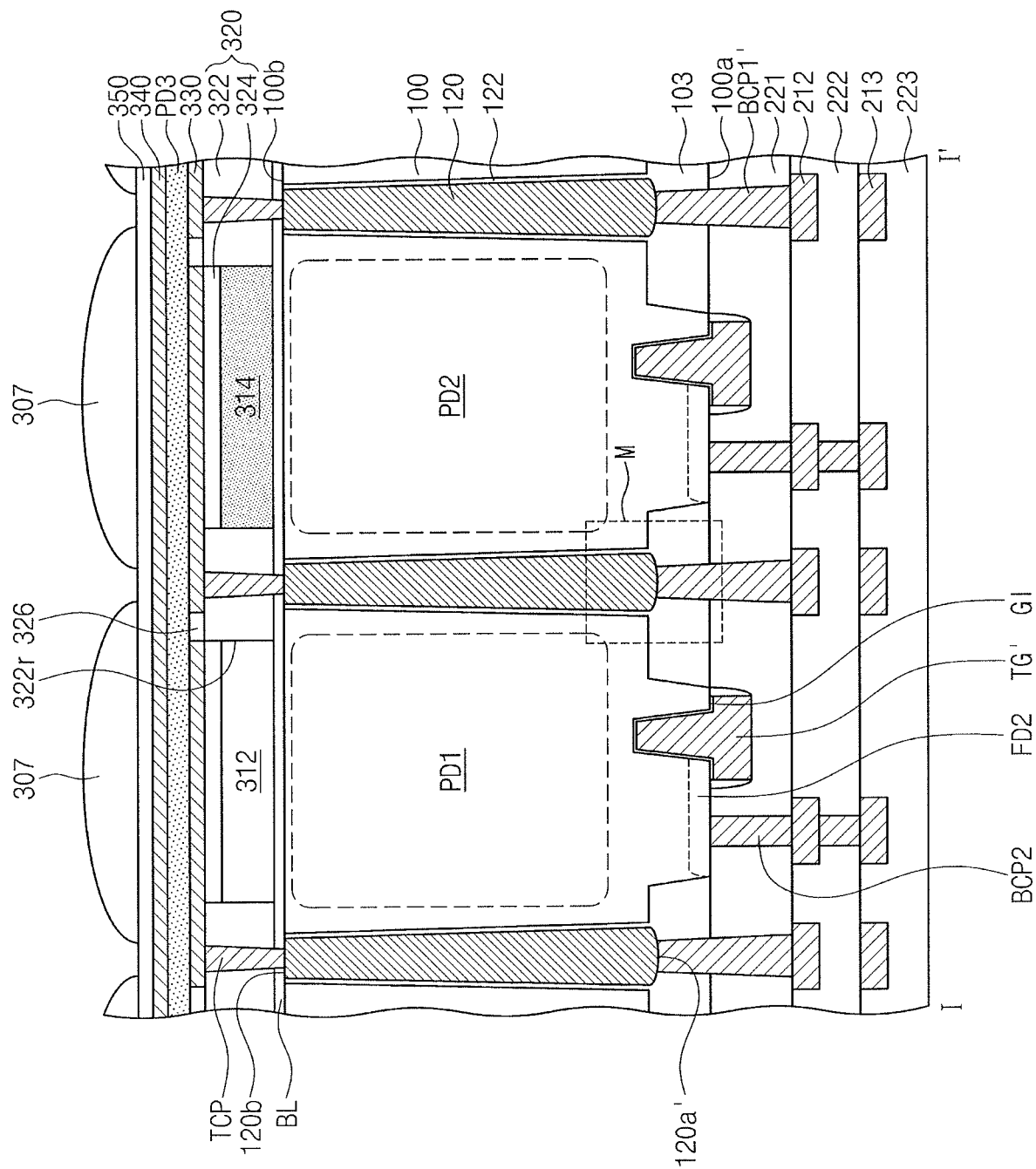
FIG. 6A illustrates a cross-sectional view taken along line I-I' of FIG. 3, showing an image sensor according to exemplary embodiments.
Figure 6B:
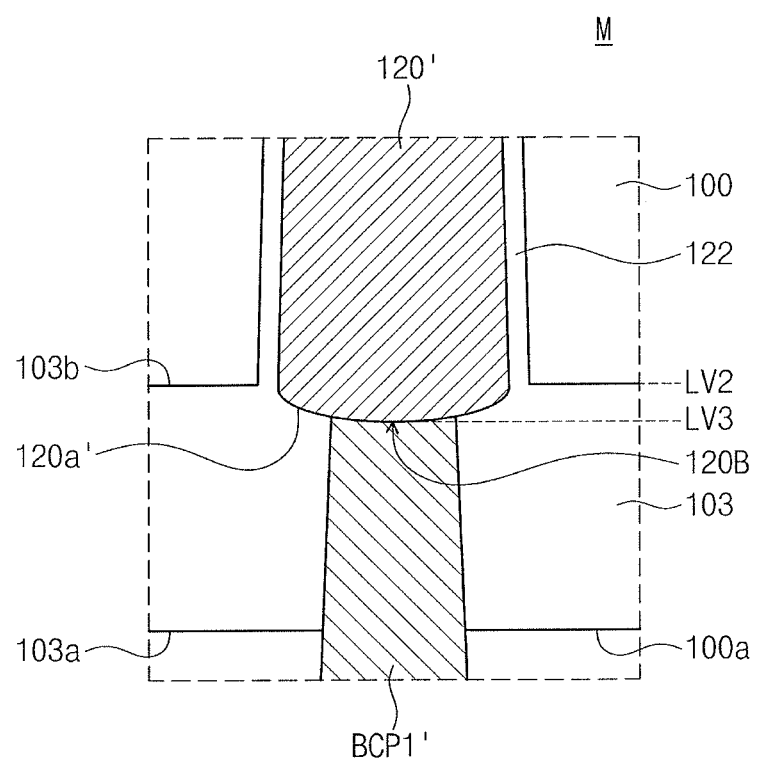
FIG. 6B illustrates an enlarged cross-sectional view of section M in FIG. 6A, showing an example of a through electrode according to exemplary embodiments.

FIG. 6A illustrates a cross-sectional view taken along line I-I' of FIG. 3, showing an image sensor according to exemplary embodiments. FIG. 6B illustrates an enlarged cross-sectional view of section M in FIG. 6A, showing an example of a through electrode according to exemplary embodiments. In the embodiment that follows, a detailed description of features repetitive to those discussed above with reference to FIGS. 4A and 5A will be omitted, and differences thereof will be discussed in detail Referring to FIGS. 6A and 6B, an opposite end 120a' of a through electrode 120' may have a non-planar shape, e.g., a rounded shape. The opposite end 120a' of the through electrode 120' may have a convex shape. For example, a center 120B' of the opposite end 120a' may protrude along the third direction D3 toward the first surface 100a of the substrate 100 (or the first surface 103a of the second device isolation layer 103). An end of the first bottom contact plug BCP1' may have a concave shape corresponding to the shape of the opposite end 120*a*' of the through electrode 120', e.g., the contact surfaces of the first bottom contact plug BCP1' and the opposite end 120*a*' of the through electrode 120' may be complementary.

The center 120B' of the opposite end 120*a*' of the through electrode 120 may be located at a third level LV3, and the second surface 103*b* of the second device isolation layer 103 may be located at the second level LV2. The third level LV3 may be lower than the second level LV2. For example, a vertical distance between the center 120B' of the opposite end 120*a*' and the first surface 103*a* of the second device isolation layer 103 may be less than a vertical distance between the second surface 103*b* of the second device isolation layer 103 and the first surface 103*a* of the second device isolation layer 103. The center 120B' of the opposite end 120*a*' may be located at a level different from that of the corner of the opposite end 120*a*'.

FIGS. 7A to 10A illustrate cross-sectional views taken along line I-I' of FIG. 3, showing stages in a method of manufacturing an image sensor according to exemplary embodiments. FIGS. 7B to 10B illustrate cross-sectional views taken along line II-II' of FIG. 3, showing stages in a method of manufacturing an image sensor according to exemplary embodiments.

Figure 7A:
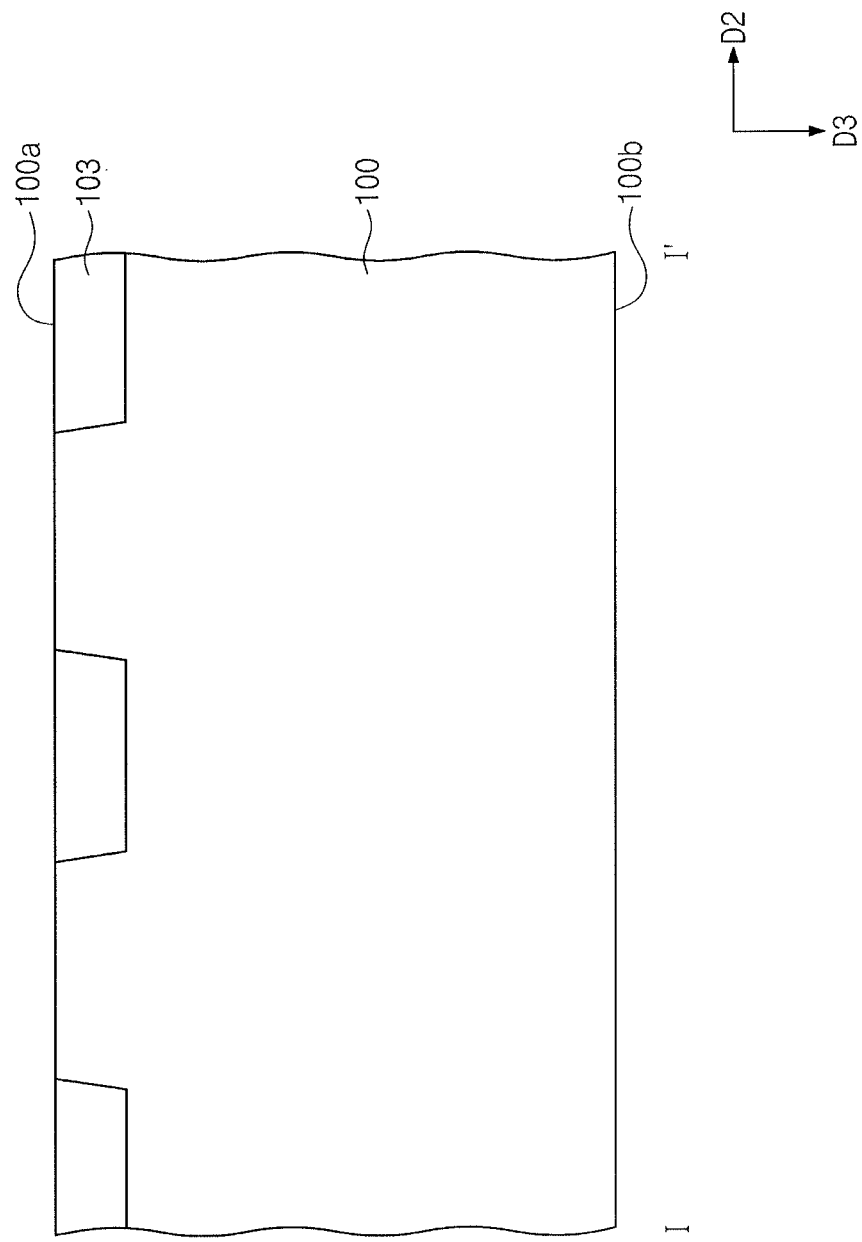
Figure 7B:
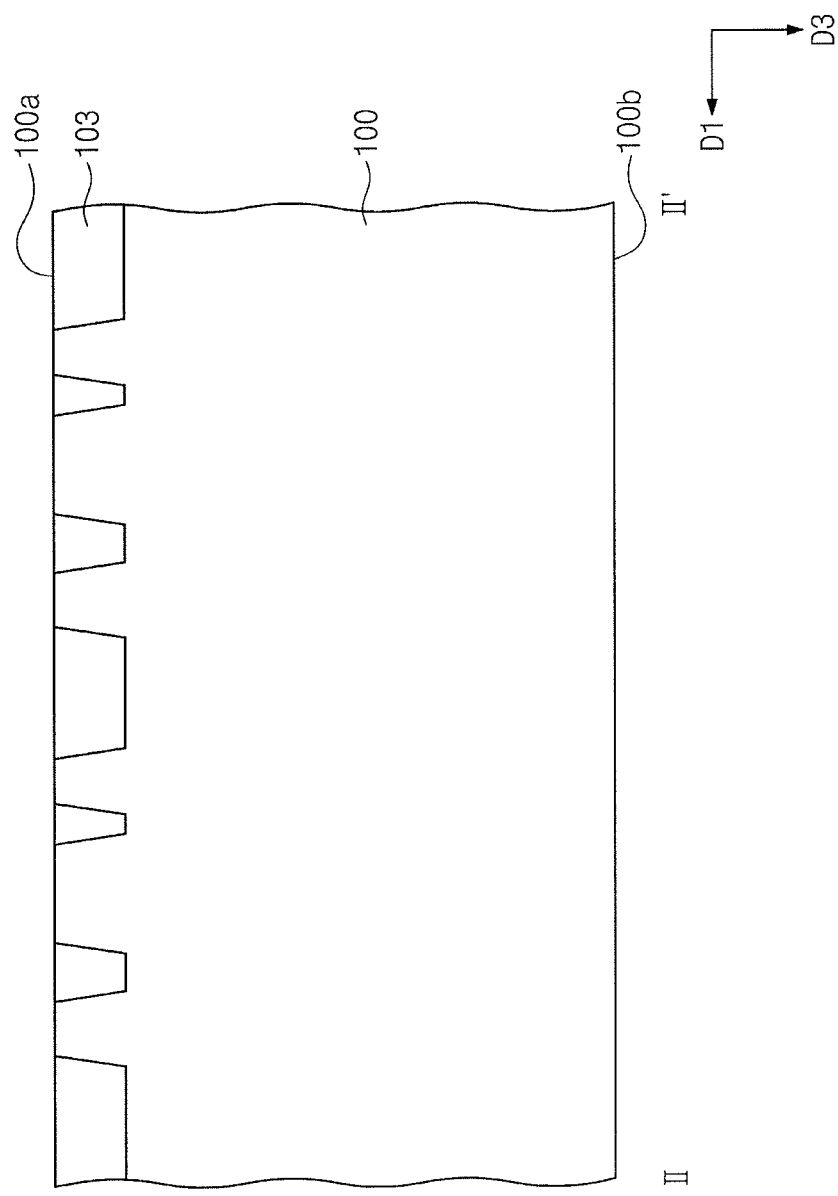

Referring to FIGS. 3, 7A, and 7B, the substrate 100 having the first surface 100*a* and the second surface 100*b* opposite to each other may be provided. The substrate 100 may include a plurality of pixels PX that are two-dimensionally arranged. The pixels PX may be two-dimensionally arranged along a first direction D1 and a second direction D2 intersecting the first direction D1. For example, the substrate 100 may be or include a bulk silicon substrate, a silicon-on-insulator (SOI) substrate, or a semiconductor epitaxial layer. The substrate 100 may be doped with impurities to have a first conductivity (e.g., p-type conductivity).

Second device isolation layers 103 may be formed in the substrate 100. The formation of the second device isolation layer 103 may include forming shallow trenches on the first surface 100*a* of the substrate 100 and filling the shallow trenches with an insulation layer. The insulation layer may be formed using silicon oxide, silicon nitride, and/or silicon oxynitride.

Figure 8B:
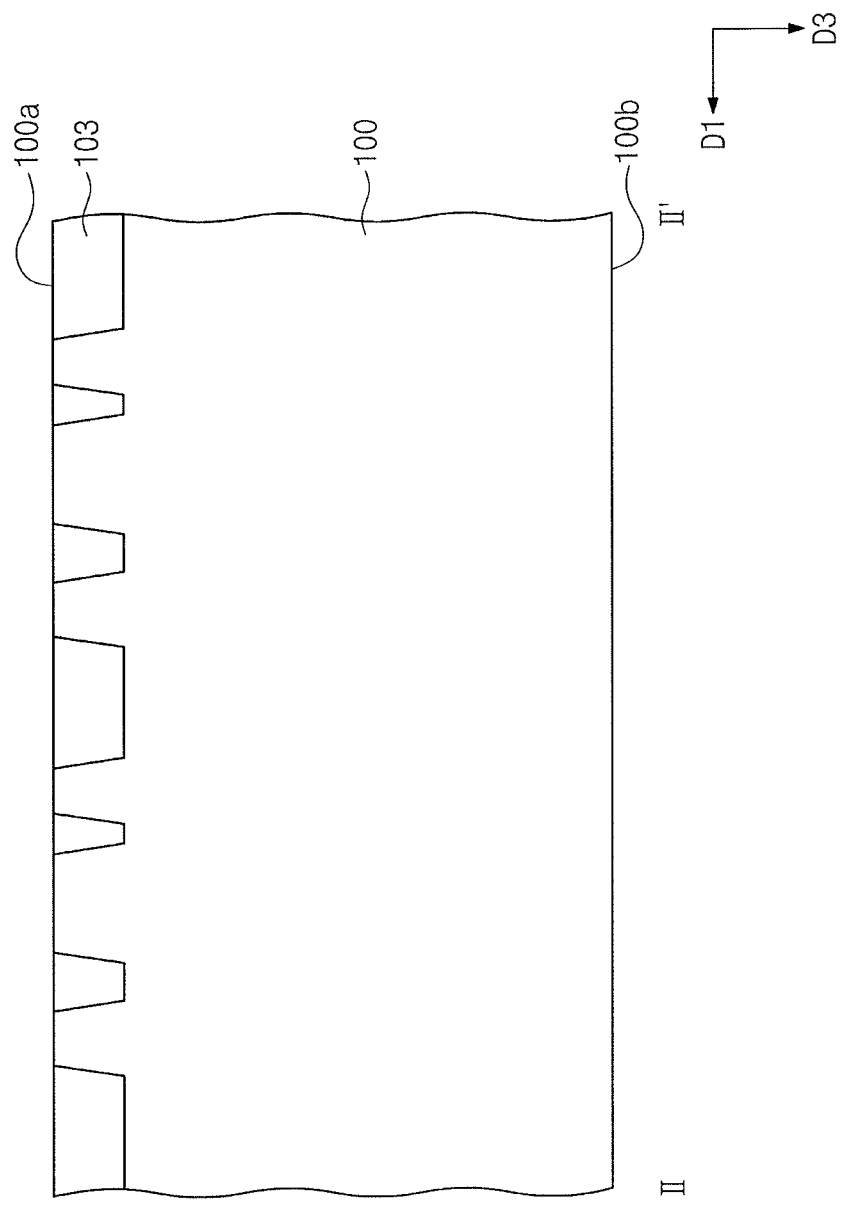

Referring to FIGS. 3, 8A, and 8B, through electrodes 120 may be formed in the substrate 100. When viewed in plan, the through electrodes 120 may be formed between the pixels PX. For example, an etching process may be performed on the first surface 100*a* of the substrate 100, thereby forming through holes 120H. A through insulation pattern 122 and the through electrode 120 may be formed in each of the through holes 120H. The through electrodes 120 may be recessed. As the through electrodes 120 are recessed, opposite ends 120*a* of the through electrodes 120 may each have a rounded shape.

For example, the through electrodes 120 may be formed using n-type doped polysilicon or p-type doped polysilicon. The through insulation patterns 122 may be formed using silicon oxide, silicon nitride, and/or silicon oxynitride.

Figure 9A:
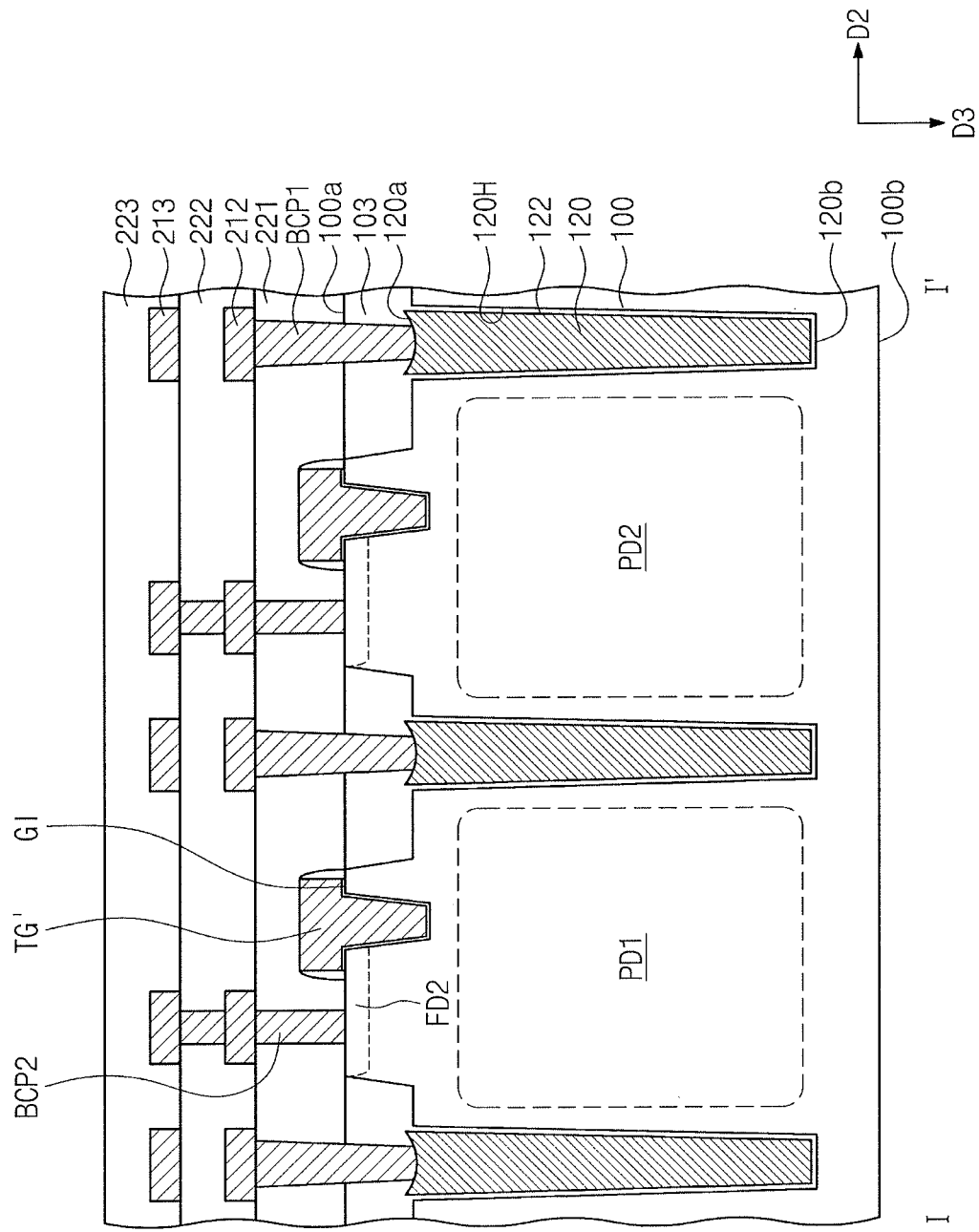
Figure 9B:
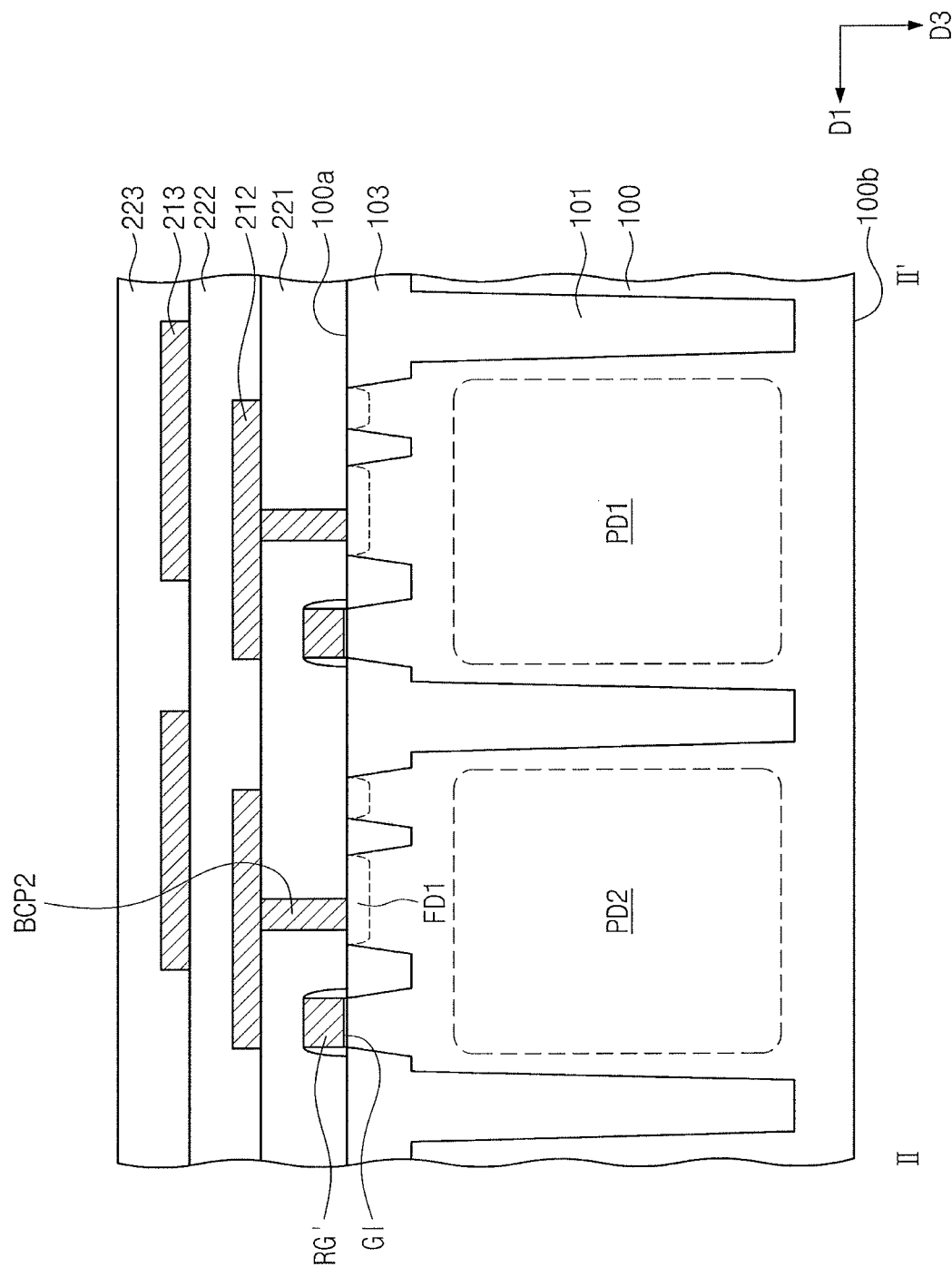

Referring to FIGS. 3, 9A, and 9B, an insulation layer may be formed on the recessed through electrodes 120. For example, the insulation layer may fill recessed regions of the second device isolation layers 103.

A first device isolation layer 101 may be formed in the substrate 100. The first device isolation layer 101 may define the pixels PX. The formation of the first device isolation layer 101 may include forming a deep trench on the first surface 100*a* of the substrate 100 and filling the deep trench with an insulation layer. The insulation layer may be formed using silicon oxide, silicon nitride, and/or silicon oxynitride.

Impurities may be doped into the pixels PX of the substrate 100, and thus first and second photoelectric conversion regions PD1 and PD2 may be formed. The first and second photoelectric conversion regions PD1 and PD2 may be doped with impurities to have a second conductivity (e.g., n-type conductivity) different from the first conductivity (e.g., p-type conductivity).

First floating diffusion regions FD1 and second floating diffusion regions FD2 may be formed on the first surface 100*a* of the substrate 100. Transfer gates TG' and reset gates RG' may be formed on the first surface 100*a* of the substrate 100. Although not shown, a first source follower gate, a first reset gate, a first select gate, a second source follower gate, and/or a second select gate may be formed on the first surface 100*a* of the substrate 100.

A first interlayer dielectric layer 221 may be formed on the first surface 100*a* of the substrate 100. The first interlayer dielectric layer 221 may be formed to cover the gates (e.g., the transfer gates TG' and the reset gates RG') on the first surface 100*a* of the substrate 100.

First bottom contact plugs BCP1 may penetrate the first interlayer dielectric layer 221 to come into contact with the through electrodes 120. Second bottom contact plugs BCP2 may penetrate the first interlayer dielectric layer 221 to come into contact with the first and second floating diffusion regions FD1 and FD2. The first and second bottom contact plugs BCP1 and BCP2 may be formed using metal (e.g., tungsten).

Second and third interlayer dielectric layers 222 and 223 may be formed on the first interlayer dielectric layer 221. First and second lines 212 and 213 may be respectively formed in the second and third interlayer dielectric layers 222 and 223.

Figure 10A:
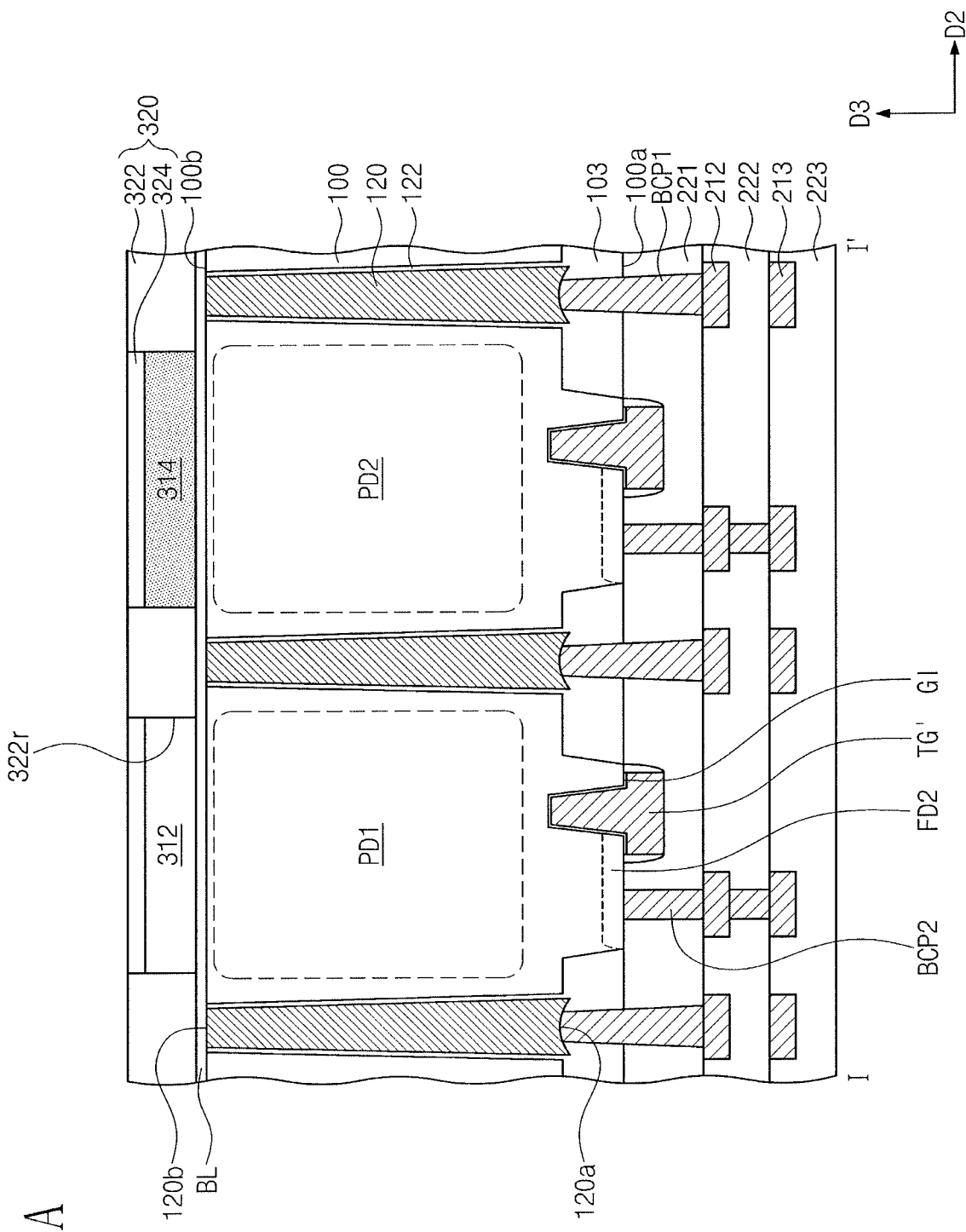
Figure 10B:
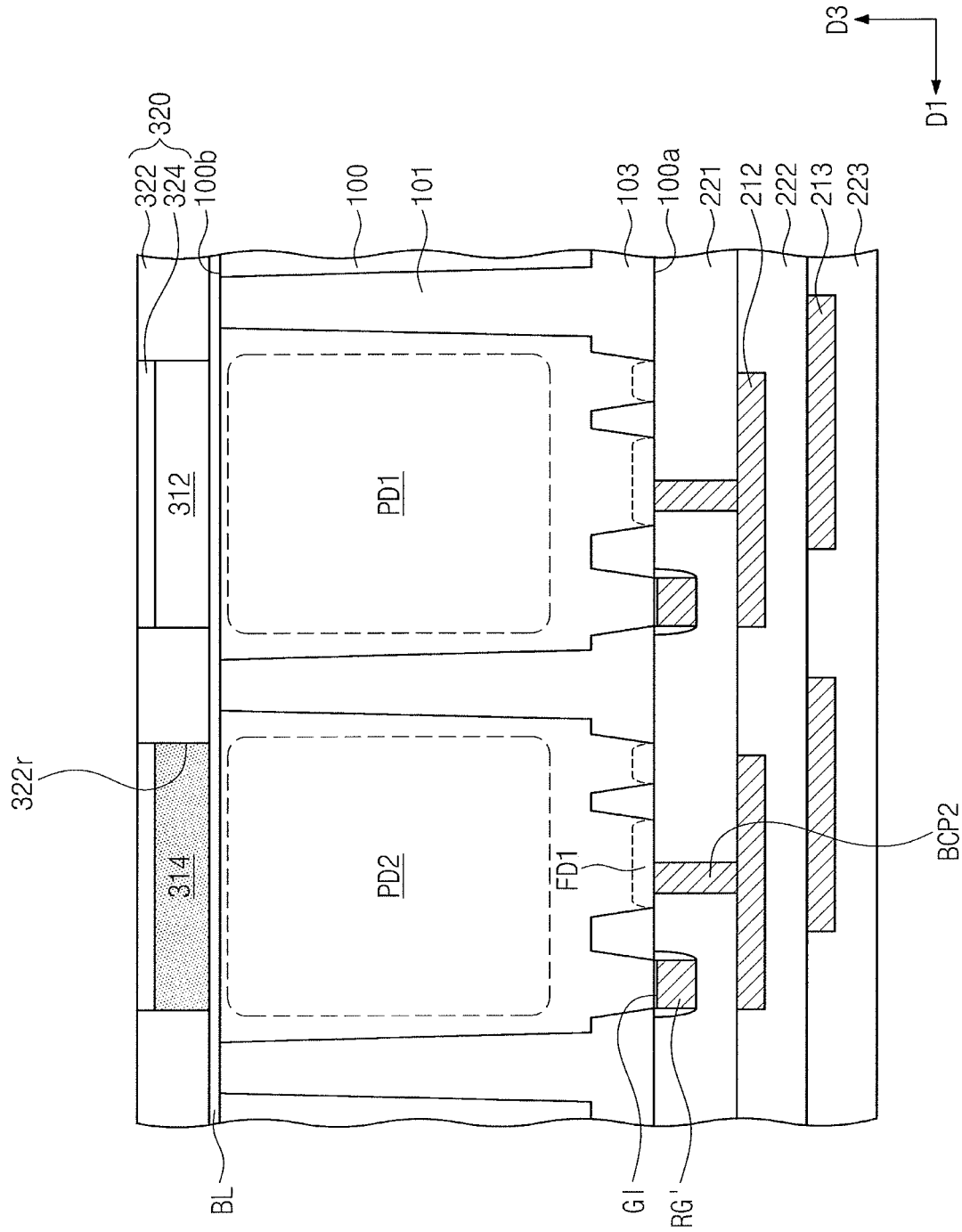

Referring to FIGS. 3, 10A, and 10B, a planarization process may be performed on the second surface 100*b* of the substrate 100. The planarization process may continue until ends 120*b* of the through electrodes 120 are exposed.

A buffer layer BL may be formed on the planarized second surface 100*b*. The buffer layer BL may mitigate defects on the second surface 100*b* of the substrate 100 that are created when the planarization process is performed. For example, the buffer layer BL may be formed using aluminum oxide and/or hafnium oxide.

An insulation structure 320 may be formed on the buffer layer BL. For example, an insulation layer may be formed on the buffer layer BL, and then patterned to form a first insulation pattern 322 having recesses 322*r*. First and second color filters 312 and 314 may be formed in the recesses 322*r*. Second insulation patterns 324 may be formed to fill the recesses 322*r*, and thus the first and second color filters 312 and 314 may be covered with the second insulation patterns 312 and 314. For example, the insulation structure 320 may be formed using silicon oxide, silicon nitride, and/or silicon oxynitride.

Referring back to FIGS. 3, 4A, and 4B, top contact plugs TCP may be formed to penetrate the insulation structure 320 and the buffer layer BL to contact the through electrodes 120. For example, the top contact plugs TCP may be formed using metal (e.g., tungsten).

Bottom electrodes 330 may be formed on the insulation structure 320 and the top contact plugs TCP. For example, the bottom electrodes 330 may be formed using ITO (Indium Tin Oxide), IZO (Indium Zinc Oxide), ZnO (Zinc Oxide), and/or an organic transparent conductive material.

A photoelectric conversion layer PD3 may be formed on the bottom electrodes 330. For example, the photoelectric conversion layer PD3 may include an organic photoelectric conversion layer. The photoelectric conversion layer PD3 may be formed using a p-type organic semiconductor material or an n-type organic semiconductor material. For another example, the photoelectric conversion layer PD3 may be formed using quantum dots or chalcogenide.

A top electrode 340 may be formed on the photoelectric conversion layer PD3. For example, the top electrodes 340 may be formed using ITO (Indium Tin Oxide), IZO (Indium Zinc Oxide), ZnO (Zinc Oxide), and/or an organic transparent conductive material. A capping layer 350 may be formed on the top electrode 340. For example, the capping layer 350 may be formed using aluminum oxide, silicon oxide, silicon nitride, and/or silicon oxynitride. Micro-lenses 307 may be formed on the capping layer 350.

An image sensor according to embodiments may decrease in resistance between the through electrode and the bottom contact plug that are connected to each other by increasing a contact area there between, and as a result, may increase in electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
   a substrate having a first surface and a second surface opposite to each other along a first direction;
   a first photoelectric conversion region and a second photoelectric conversion region in the substrate;
   a through electrode between the first and second photoelectric conversion regions and extending along the first direction, the through electrode having a first end adjacent to the first surface and a second end adjacent to the second surface, the first end having a non-planar shape;
   an interlayer dielectric layer on the first surface of the substrate;
   an insulation structure on the second surface of the substrate;
   a bottom contact plug penetrating the interlayer dielectric layer to contact the first end of the through electrode;
   a first color filter and a second color filter respectively provided on the first and second photoelectric conversion regions; and
   a photoelectric conversion layer on the insulation structure and electrically connected to the through electrode,
   wherein a corner of the first end of the through electrode protrudes along the bottom contact plug toward the first surface of the substrate more than a center of the first end of the through electrode in contact with the bottom contact plug.

2. The image sensor as claimed in claim 1, further comprising a first device isolation layer on the first surface of the substrate and having a first surface and a second surface opposite to each other,
   wherein the first surface of the first device isolation layer is substantially coplanar with the first surface of the substrate, and
   wherein the corner of the first end of the through electrode is located at a level different from that of the second surface of the first device isolation layer along the first direction.

3. The image sensor as claimed in claim 1, further comprising a second device isolation layer in the substrate and defining a first pixel and a second pixel,
   wherein the first and second photoelectric conversion regions are respectively provided in the first and second pixels.

4. The image sensor as claimed in claim 1, wherein the second end of the through electrode has a planar shape.

5. The image sensor as claimed in claim 1, further comprising:
   a first floating diffusion region and a second floating diffusion region that are provided on the first surface of the substrate; and
   a transfer gate on the first surface of the substrate and adjacent to the second floating diffusion region,
   wherein the first floating diffusion region is electrically connected via the through electrode to the photoelectric conversion layer.

6. The image sensor as claimed in claim 5, further comprising:
   an interlayer dielectric layer on the first surface of the substrate and covering the first and second floating diffusion regions and the transfer gate;
   a contact region of the bottom contact plug that is complementary to the non-planar shape to the first end of the through electrode; and
   a line on the bottom contact plug,
   wherein the line is electrically connected to the first floating diffusion region.

7. The image sensor as claimed in claim 1, further comprising:
   a bottom electrode between the insulation structure and the photoelectric conversion layer; and
   a top contact plug penetrating the insulation structure to contact the second end of the through electrode,
   wherein the photoelectric conversion layer is electrically connected to the through electrode via the bottom electrode and the top contact plug.

8. The image sensor as claimed in claim 7, further comprising a top electrode covering a top surface of the photoelectric conversion layer,
   wherein the bottom electrode and the top electrode include a transparent conductive material.

9. The image sensor as claimed in claim 1, wherein a center of the first end of the through electrode protrudes toward the first surface of the substrate.

10. The image sensor as claimed in claim 1, wherein the corner of the first end of the through electrode is spaced from the bottom contact plug.

11. An image sensor, comprising:
    a substrate having a first surface and a second surface opposite to each other;
    a first photoelectric conversion region and a second photoelectric conversion region in the substrate;
    a floating diffusion region on the first surface of the substrate;
    a photoelectric conversion layer on the second surface of the substrate;

a through electrode between the first and second photoelectric conversion regions; and a device isolation layer on the first surface of the substrate, and having a third surface and a fourth surface opposite to each other, wherein the through electrode electrically connects the photoelectric conversion layer and the floating diffusion region to each other, the third surface of the device isolation layer is substantially coplanar with the first surface of the substrate, a first end of the through electrode is adjacent to the first surface, a corner of the first end of the through electrode is located at a level different from that of a center of the first end of the through electrode, and the corner of the first end of the through electrode is located at a level between the third surface and the fourth surface of the device isolation layer.

12. The image sensor as claimed in claim 11, wherein the corner of the first end of the through electrode protrudes toward the first surface of the substrate more than the center of the first end of the through electrode.

13. The image sensor as claimed in claim 11, wherein the center of the first end of the through electrode protrudes toward the first surface of the substrate.

14. The image sensor as claimed in claim 11, further comprising:
a first color filter between the first photoelectric conversion region and the photoelectric conversion layer; and
a second color filter between the second photoelectric conversion region and the photoelectric conversion layer.

15. An image sensor, comprising:
a first pixel having a first photoelectric conversion region;
a second pixel having a second photoelectric conversion region;
a photoelectric conversion layer on the first and second pixels; and
a through electrode between the first and second pixels and electrically connected to the photoelectric conversion layer, wherein the through electrode has a first end and a second end, opposite to the first end, the second end being adjacent to the photoelectric conversion layer, the second end having a planar shape and the first end having a non-planar shape, and wherein the first end of the through electrode is recessed toward the second end of the through electrode.

16. The image sensor as claimed in claim 15, wherein a width of the through electrode decreases with approaching from the first end to the second end.

17. The image sensor as claimed in claim 15, wherein
the first photoelectric conversion region generates a first photoelectric signal from light having a first wavelength,
the second photoelectric conversion region generates a second photoelectric signal from light having a second wavelength, and
the photoelectric conversion layer generates a third photoelectric signal from light having a third wavelength.

18. The image sensor as claimed in claim 15, further comprising:
a floating diffusion region in at least one of the first and second pixels; and
a bottom contact plug connected to the first end of the through electrode, a contact region of the bottom contact plug being complementary to the non-planar shape to the first end of the through electrode,
wherein the through electrode and the bottom contact plug electrically connect the photoelectric conversion layer to the floating diffusion region.

19. The image sensor as claimed in claim 18, wherein an edge of the first end of the through electrode is spaced from the bottom contact plug.

* * * * *